United States Patent [19]
Jinno

[11] Patent Number: 6,010,923
[45] Date of Patent: Jan. 4, 2000

[54] MANUFACTURING METHOD OF SEMICONDUCTOR DEVICE UTILIZING ANNEALED SEMICONDUCTOR LAYER AS CHANNEL REGION

[75] Inventor: Yushi Jinno, Gifu, Japan

[73] Assignee: Sanyo Electric Co., Ltd., Osaka, Japan

[21] Appl. No.: 09/049,313

[22] Filed: Mar. 27, 1998

[30] Foreign Application Priority Data

Mar. 31, 1997 [JP] Japan ................................. 9-079992
Mar. 31, 1997 [JP] Japan ................................. 9-081476
Mar. 31, 1997 [JP] Japan ................................. 9-081477

[51] Int. Cl.$^7$ ................................................ H01L 21/00
[52] U.S. Cl. ........................... 438/158; 438/159; 438/162
[58] Field of Search ................................. 438/158, 159, 438/162

[56] References Cited

U.S. PATENT DOCUMENTS

| | | | |
|---|---|---|---|
| 5,273,919 | 12/1993 | Sano et al. | 437/40 |
| 5,527,726 | 6/1996 | Possin et al. | 437/41 |
| 5,567,633 | 10/1996 | Gossain et al. | 437/40 |
| 5,627,085 | 5/1997 | Gossain et al. | 438/162 |
| 5,705,411 | 1/1998 | Yamanobe et al. | 437/40 |
| 5,728,610 | 3/1998 | Gosain et al. | 438/162 |
| 5,872,021 | 2/1999 | Matsumoto et al. | 438/30 |
| 5,923,963 | 7/1999 | Yamanaka | 438/157 |
| 5,926,701 | 7/1999 | Li | 438/158 |

*Primary Examiner*—John F. Niebling
*Assistant Examiner*—Michael S. Lebentritt
*Attorney, Agent, or Firm*—Loeb & Loeb, LLP

[57] ABSTRACT

There is provided a semiconductor device in which a semiconductor layer and a gate electrode are formed with a gate insulating layer between then and in which a region of the semiconductor layer opposite to the gate electrode is used as a channel region. On the semiconductor layer, an insulating protection film and an amorphous semiconductor layer are successively formed. The protection film covers at least the channel region of the amorphous semiconductor layer, and annealing is applied to the amorphous semiconductor layer, thereby converting the amorphous semiconductor layer into the polycrystal semiconductor layer. A portion to be the channel region of the amorphous semiconductor layer is covered by the protection film. Therefore, even when exposed to the atmosphere due to annealing, surface contamination can be prevented and a semiconductor device having satisfactory characteristics can be obtained. A thickness d of the protection film is set to be nearly "$\lambda/4n$" for a wavelength $\lambda$ of laser beam and a refractive index n of materials for the protection film. If there is unevenness of the thickness of the amorphous semiconductor layer to be formed, the protection film will be formed, with its thickness being optimum for a region which the amorphous semiconductor layer is formed thickest. On the other hand, if there is unevenness of the thickness of a gate insulating layer, the protection film will be formed, with its thickness being optimum for a region which the gate insulating layer is formed thinnest.

20 Claims, 19 Drawing Sheets

MANUFACTURING METHOD OF SEMICONDUCTOR DEVICE UTILIZING ANNEALED SEMICONDUCTOR LAYER AS CHANNEL REGION

BACKGROUND OF THE INVENTION

1. Field of the Invention

The present invention relates to a method of manufacturing a semiconductor device, in particular, a method of manufacturing a driver circuit integral type liquid crystal display LCD in which a thin film transistor TFT using a polycrystal semiconductor layer is formed at a display section and a frame section.

2. Description of the Related Art

Attempts have been made to use the technology of forming a semiconductor film on a substrate in order to enhance integration of an integrated circuit and realize great capacity. Attempts have also been made to mass produce an active matrix type LCD enabling the display of a high resolution and animation image by using a TFT as a switching element of a matrix picture element section on one side of a pair of substrates between which liquid crystal is sandwiched.

In particular, if a TFT having characteristics similar to a MOSFET produced on a silicon substrate can be formed on an insulating substrate, it will be possible to make an integral peripheral driver circuit for supplying a desired driving signal voltage to the matrix picture element section by forming a CMOS on the frame of the substrate, and not only the switching element of the LCD's matrix picture element section. In this way, mass production of an LCD with integrated driver circuit can be achieved.

As an LCD with integrated driver circuit does not require connection of a driver IC to a liquid crystal panel, manufacturing may be simplified and the frame of the device can be miniaturized. In particular, miniaturization of the frame enables miniaturization of the commodity used above LCD module as a monitor in applications such as portable information terminals, handhold video cameras, or the like.

By using a polycrystal semiconductor, in which a large number of monocrystal grains having grain diameter of several hundreds to several thousands of Å exist such that they are in contact as material for a channel layer, such a TFT can become a high speed element applicable to a driver section. In particular, polycrystal silicon, namely, polysilicone (p-Si), can result inmobility of approximately several tens to several hundreds of $cm^2/V\cdot s$. This mobility is two digits larger than that of amorphous silicon (a-Si). Therefore, by forming an N-chTFT and a P-chTFT, a CMOS which has an adequate speed as a driver of LCD is formed.

The applicant of the present invention has developed a method of limiting the processing temperature to below approximately 600° C. This enables rationalizing costs and enables the use of cheap substrates with low heat resistance, such as non-alkali glass substrates or the like. Such a p-SiTFTLCD manufacturing process, one in which the temperature of the complete process is restrained below the heat resistance temperature of the substrate is known as a low temperature process.

In FIG. 1, a section of such a p-Si TFT is shown. On the left side of the drawing, an N-ch TFT is shown, whereas the right side shows a P-ch TFT. On a substrate 50, a gate electrode 51 which is composed of metal such as Cr is formed. A gate insulating film 52 composed of SiNx and/or $SiO_2$ is further formed in such a manner that the gate insulating film 52 covers the gate electrode 51. On the gate insulating film 52, ap-Si film 53 is formed and, an implantation stopper 54, such as $SiO_2$, patterned on the shape of the gate electrode 51, is then formed on the p-Si film 53. By utilizing the implantation stopper 54, two lightly doped regions LDs which contain lightly doped N type impurities (N−) and a source region S and a drain region D both of which are arranged outside of the LDs and contain heavily doped N type impurities (N+), respectively, are formed on the N-ch side of the p-Si film 53. On the other hand, similarly on the P-ch side of the p-Si film 53, a source region [S] and a drain region [D] which contain heavily doped P type impurities [P+] are formed. Channel regions CHs are formed on the both sides of the N-ch and the P-ch, just under the implantation stoppers 54. These CHs are intrinsic layers which do not substantially contain impurities. Interlayer insulating films 55 composed of SiNx are formed in such a manner that they cover the p-Si films 53. On the interlayer insulating films 55, a source electrode 56 and a drain electrode 57 which are composed of metal are formed. These electrodes are connected with the source region [S] and the drain region [D] via contact holes which are made in the respective interlayer insulating films 55. Here, in the picture element section, a pixel electrode for driving liquid crystal composed of a transparent conductive film, such as indium tin oxide ITO, further is formed on the interlayer insulating film which covers the source electrode 56 and the drain electrode 57. The pixel electrode is connected with the source electrode 56.

Such constitution that an intervening LD is formed between the channel region and the source and drain regions S. D. as shown in the N-ch is known as a lightly doped drain LDD. Such LDD constitution is adopted in the LCD for the purpose of suppression of OFF-state current.

Further, it is also acceptable to be a channel doped type TFT which have doped channel regions on the N-ch and P-ch by doping impurities of which conductivity types are opposed to that of the source and drain regions before doping the impurities to the p-Si film 53 as described above.

Such a TFT may be manufactured in the following manner. First, just after forming the gate electrode 51 by sputtering and etching of Cr, SiNx, and $SiO_2$, which will be the gate insulating film 52, and the a-Si film are consecutively formed by a plasma CVD process without breaking a vacuum. Then, by applying laser annealing to the a-Si film for polycrystallization, the p-Si film 53 is formed. After the $SiO_2$ is formed on the p-Si film 53, positive type resist is formed on the $SiO_2$. The resist is then exposed to light through back-exposure such that light is radiated to the resist from the substrate 50 side, reversing the pattern shape of the gate electrode 51. The resist is developed in one step and then the implantation stopper 54 is formed in the same shape as that of the gate electrode 51 by etching an insulating film using the resist as a mask. An N type conductive impurity ion, such as phosphorus P, is then lightly doped using the implantation stopper 54 (resist) as a mask, and the channel region CH, which is just under the implantation stopper, and the LDs, which are on the both sides of the channel region, are formed. The resist is then formed in a shape larger than that of the implantation stopper 54. By heavily doping the N type impurity ion using the resist as a mask, the source region S and the drain region D are formed. Thus, on the N-ch side, the LDD constitution in which the LDs intervene between the channel region CH and the source and drain regions S and D is completed.

With regard to the P-ch side, by similarly reflecting the configuration of the gate electrode 51, the source and drain regions S and D in which P type impurities are heavily doped are formed outside the channel region CH. However, on the P-ch side, the LDD constitution is not adopted.

Next, the interlayer insulating films 55 which cover the N-ch and P-ch TFTs are formed. The contact holes CT are made, a metal film such as Al or Al and Mo is formed, and the source and drain electrodes 56 and 57 are formed by etching. These electrodes are connected to the source region S and the drain region D via contact holes CT, respectively.

The p-Si film is formed by laser annealing to the a-Si film, and, before this annealing step, the vacuum atmosphere of the a-Si film forming step, is broken. At this time, impurities, such as Na adsorb on the surface of the a-Si film or the p-Si film. If these impurity ions are taken into devices, they will cause flat-band voltage to change as moving ions, thereby changing a threshold value. Further, since the p-Si film 53 and the gate insulating film 52 which is a layer under the p-Si film 53 are consecutively formed by the CVD process, a lattice condition of the interface between the gate insulting film 52 and the p-Si film 53 is comparatively good. However, since the top surface of the p-Si film 53 is exposed after forming the a-Si film, there is a lattice defect and the density of the interface state is high. These numerous interface states become traps by producing energy levels in a band gap, thereby taking in electrons from a conduction band and emitting them to a valence band, and drawing electrons in the valence band and then sending them to the conduction band. This causes a problem of lowering an ON-OFF ratio.

SUMMARY OF THE INVENTION

The present invention, which is made in order to solve the problems described above, is directed to provide a method of manufacturing semiconductor device having good electrical characteristic.

The present invention is a method of manufacturing a semiconductor device in which at least a part of a semiconductor layer is used as an channel region of a semiconductor element, wherein, on the aforementioned semiconductor layer, an insulating protection film for protecting the aforementioned semiconductor layer is formed in such a manner that the aforementioned semiconductor and the aforementioned insulating protection film are successively formed, and annealing is applied to the aforementioned semiconductor layer in such that the aforementioned protection film covers at least the channel region of the semiconductor layer.

Thus, exposure of the semiconductor layer and, in particular, the channel region to the atmosphere is prevented. No contaminated or lattice defect arises in an interface of the semiconductor layer and the upper layer and an interfacial level (interface state) arises. Consequently, a semiconductor device having good characteristics can be obtained.

The semiconductor device obtained is one in which at least part of a polycrystal semiconductor layer is used as an channel region of a thin film transistor; on the polycrystal semiconductor layer, there is provided an insulating protection film for protecting the polycrystal semiconductor layer, successively formed in such a manner that the aforementioned insulating protection film covers at least the area the channel region of the polycrystal semiconductor layer. There is also provided a constitution in which the aforementioned polycrystal semiconductor layer is a semiconductor layer which can be obtained after going through annealing and polycrystallization in such a state that the protection film is formed at least on an amorphous semiconductor layer.

Further, in the present invention, a first conductive layer is formed on a substrate and a first electrode is formed by patterning the first conductive layer; a first insulating layer is formed in such a manner that the first electrode is covered, an amorphous semiconductor layer is formed on the first insulating layer, and an insulating protection film is successively formed on the aforementioned amorphous semiconductor layer. The protection film is patterned and left only a channel region formed at a location of the amorphous semiconductor layer opposite to the aforementioned first electrode. With the protection film being left on the channel region, a polycrystal semiconductor layer is formed by polycrystallization of the amorphous semiconductor layer resulting from annealing which is applied to the amorphous semiconductor layer; impurity doped regions are formed on both sides of the channel region in the polycrystal semiconductor layer; and, a second insulating layer is then formed in such a manner that the polycrystal semiconductor layer is covered, and openings are formed on the impurity doped regions of the polycrystal semiconductor layer of the second insulating layer. Second electrodes, connected with the impurity doped regions, are formed at the openings.

Thus, a region of semiconductor layer which is to be a channel layer is formed successively with the insulating films which are on the upper and lower sides of the channel layer. Contamination of the semiconductor layercan thereby be presented. Further, the surface and back of the semiconductor layer include no lattice defects and good electrical properties can be obtained.

Further, if the thickness of the aforementioned protection film is d, the wavelength of laser light to be radiated is $\lambda$, and the refractive index of the aforementioned protection film is n, by setting values such that the relationship "$d=\lambda/4n$," is approximately satisfied in a region in which the first electrode is arranged in such a manner that the first electrode and the semiconductor layer face each other, loss of energy due to thermal diffusion of laser radiation by the first electrode can be compensated for by the protection film.

Further, in the present invention, the semiconductor device may be a semiconductor device in which the semiconductor layer and an electrode are formed on a substrate with an insulating layer between them and a region of the semiconductor layer opposite to the aforementioned electrode is used as the channel region. The protection film is formed in succession with the semiconductor layer, with its thickness being optimum for the thickest the semiconductor layer region on the identical substrate.

Further, annealing of the semiconductor layer is done to polycrystallize the amorphous state semiconductor layer which is formed in, and the semiconductor layer is irradiated with laser light from a side of the aforementioned protection film formed.

Further, the semiconductor device of the present invention which relates to the manufacturing method may be a semiconductor device in which a polycrystal semiconductor layer polycrystallized by annealing and an electrode are formed in such a manner that they face each other with an insulating layer between them and a plurality of thin film transistors using as an channel region a region of the polycrystal semiconductor layer opposite to the electrode are formed on the identical substrate. On the polycrystal semiconductor layer, there is provided an insulating protection film which is successively formed in such a manner that at least the channel region of the polycrystal semiconductor layer is covered, this protection film being formed with its thickness being optimum in a region which an amorphous semiconductor layer to be a material for the polycrystal semiconductor layer is thickest. The polycrystal semiconductor layer is a semiconductor layer obtained after under going annealing and polycrystallization of the amorphous semiconductor layer in such a state that the aforementioned protection film is formed at least on the amorphous semiconductor layer.

Thus, in a region to which a thick semiconductor layer is deposited, laser energy more efficiently radiators to a protection film, whereas in a region to which a thin semiconductor layer is deposited, laser energy radiation to a protection film is less efficient. Therefore, the density of energy actually given to the semiconductor layer remains uniform. Further, a protection film is provided only in an channel region which most greatly influences electrical characteristic. Even though impurity gases are desorbed and generated from the semiconductor layer at the time of laser annealing, the gases can emerge from a side of the protection film and therefore, impurities entering the protection film and causing lattice defects in the interface with the semiconductor layer, and increasing the density of interface state is increased can be prevented.

Further, in the present invention, the semiconductor device may be a semiconductor device in which the semiconductor layer and an electrode are formed with an insulating layer between and a region of the semiconductor layer opposite to the electrode is used as the channel region. The protection film to be formed in succession with the semiconductor layer is formed, with its thickness being made optimum for a region which the insulating layer is formed thinnest on the identical substrate.

Further, the semiconductor device of the present invention which relates to the aforementioned manufacturing method may be a semiconductor device in which a polycrystal semiconductor layer polycrystallized by annealing and an electrode are formed in such a manner that they face each other with an insulating layer between them, while a plurality of thin film transistors using as a channel region a region of the polycrystal semiconductor layer opposite to the electrode are formed on the substrate. On the polycrystal semiconductor layer, there is provided an insulating protection film which is successively formed in such a manner that at least the channel region of the polycrystal semiconductor layer is covered. This protection film is formed after being set to an optimum thickness in a region in which the insulating layer is formed thinnest on the substrate. The polycrystal semiconductor layer is a semiconductor layer obtained after under going annealing and polycrystallization of the amorphous semiconductor layer in such a state that the protection film is formed at least on an amorphous semiconductor layer.

In such condition that an insulating layer is sandwiched between semiconductor layer and an electrode, unevenness of the thickness of the insulating layer leads to unevenness of heat capacity in a region to which laser light is radiated during annealing. If the insulating layer is thin, heat capacity in the region will be small, whereas if the insulating layer is thick, heat capacity in the region will be large. Therefore, the actual energy supplied to the semiconductor layer by annealing may occasionally be insufficient for a region in which an insulating film is thin. Under the circumstances, if it is set so that a protection film having an optimum thickness is formed in a region in which an insulating film is thin, a greater amount of annealing energy will be supplied to the semiconductor layer due to the presence of the protection film having an optimum thickness. On the other hand, when a protection film is formed in a region, there is unevenness of thickness of the protection film in the region. If a protection film having an optimum thickness, namely a protection film having a thickness such that energy to be supplied to a semiconductor layer at the time of annealing is maximum, is formed in the region in which the insulating film is thin, the protection film to be formed in a region in which an insulating layer is thick will not have an optimum thickness due to the influence of this unevenness. For a region which supplies more annealing energy to a semiconductor layer due to a thick insulating layer, energy less than that of other regions is supplied to the semiconductor layer at the time of annealing due to a protection film whose thickness is not optimum. Annealing energy more than that of other regions being supplied to the semiconductor layer is thereby prevented.

Further, by employing the manufacturing method of a semiconductor device described above, a thin film transistor is formed as a semiconductor element, and the thin film transistor is used as a switching element for driving each picture element of a matrix type display unit and/or a switching element of a driver circuit of a matrix type display unit. Thus, a plurality of thin film transistors having uniform characteristics can be simultaneously formed on a large substrate, making it possible to provide a cheap and satisfactory display unit with uniform display screen quality, for example a TFT-LCD.

Further, in the above described manufacturing method of the present invention, when the protection film remains on the channel region, a polycrystal semiconductor layer is formed after going through annealing and polycrystallization of the amorphous semiconductor. An implantation stop material film is then formed on an upper part of the polycrystal semiconductor layer on which the protection film is formed, and an implantation stopper layer is formed by patterning the material film so as to have an almost identical shape to that of the protection film. Using at least the implantation stopper layer as a mask, impurity doped regions on both sides of the channel region in the polycrystal semiconductor layer are formed.

As describe above, once the implantation stopper layer and the protection film are made similarly shaped, impurities are doped in the polycrystal semiconductor layer using the implantation stopper as a mask. Therefore, an interface is kept clean because of the protection film, and it is prevented that impurity doped regions and an edge of a semiconductor region which is to be an channel region will not polycrystallize due to the presence of the protection film as they are formed apart.

In particular, in the above described manufacturing method of the semiconductor device according to the present invention, the protection film is left on the amorphous semiconductor layer, after having been patterned in advance so that a length of the protection film in an channel length direction of the channel region is longer than that of the implantation stopper layer. Etching of the protection film in the same shape of the stopper layer is simultaneously performed with the forming of the implantation stopper layer by patterning the implantation stop material film after annealing the amorphous semiconductor layer.

As described above, after applying annealing to the semiconductor layer with a wide area covered by a protection film, an implantation stopper layer is formed in an area narrower than the covered area and ion doping is performed. Thus, an interface is kept clean by the protection film and it is more certainly prevented that impurity doped regions and an edge of a semiconductor region which is to be an channel region certainly polycrystallize due to the presence of the protection film are not formed apart. Further, when the implantation stopper layer is formed by patterning the implantation stop material film, etching of the protection film in a same shape of the stopper layer is simultaneously performed. Thus, without having a surplus removing process, the implantation stopper layer and the protection film can be automatically formed of an identical shape.

Further, in the aforementioned semiconductor device manufacturing method, patterning of the protection film and the implantation stop material film may be performed by forming a resist layer on each of the films, by exposing to light the resist layer other than regions which are to be shade of the first electrode through back-exposure such that light is radiated from the backside of the substrate and removing exposed regions of the resist layer, and by etching the protection film or the implantation stop material film using remaining resist layer as a mask. The duration of radiation from the backside of the substrate is shorter than the duration of radiation at the time of the back-exposure in patterning of the implantation stop material film. Alternatively, the intensity of exposing light from the backside of the substrate at the time of the back-exposure in patterning of the protection film may be weaker than intensity of exposing light at the time of the back-exposure in patterning of the implantation stop material film.

As described above, because patterning of the protection film and implantation stopper can be performed using the identical first electrode, it is not necessary to provide a surplus alignment margin. Thus, a thin film transistor can be formed in a smaller area and a high performance thin film transistor with less misalignment can be produced. Further, by shortening the duration of radiation or by setting a low intensity of radiation at the time of exposure in patterning of the protection film, the implantation stopper layer and the identical first electrode are used as a pattern mask, whereby it is easy to adjust the size of the first pattern of the protection film.

DESCRIPTION OF THE PREFERRED EMBODIMENTS

Embodiment 1

FIGS. 2A to 2H are process sections which show a semiconductor device and its manufacturing methods according to an Embodiment 1 of the present invention. In these drawings, an N-ch TFT is used as an example.

Figure 1:
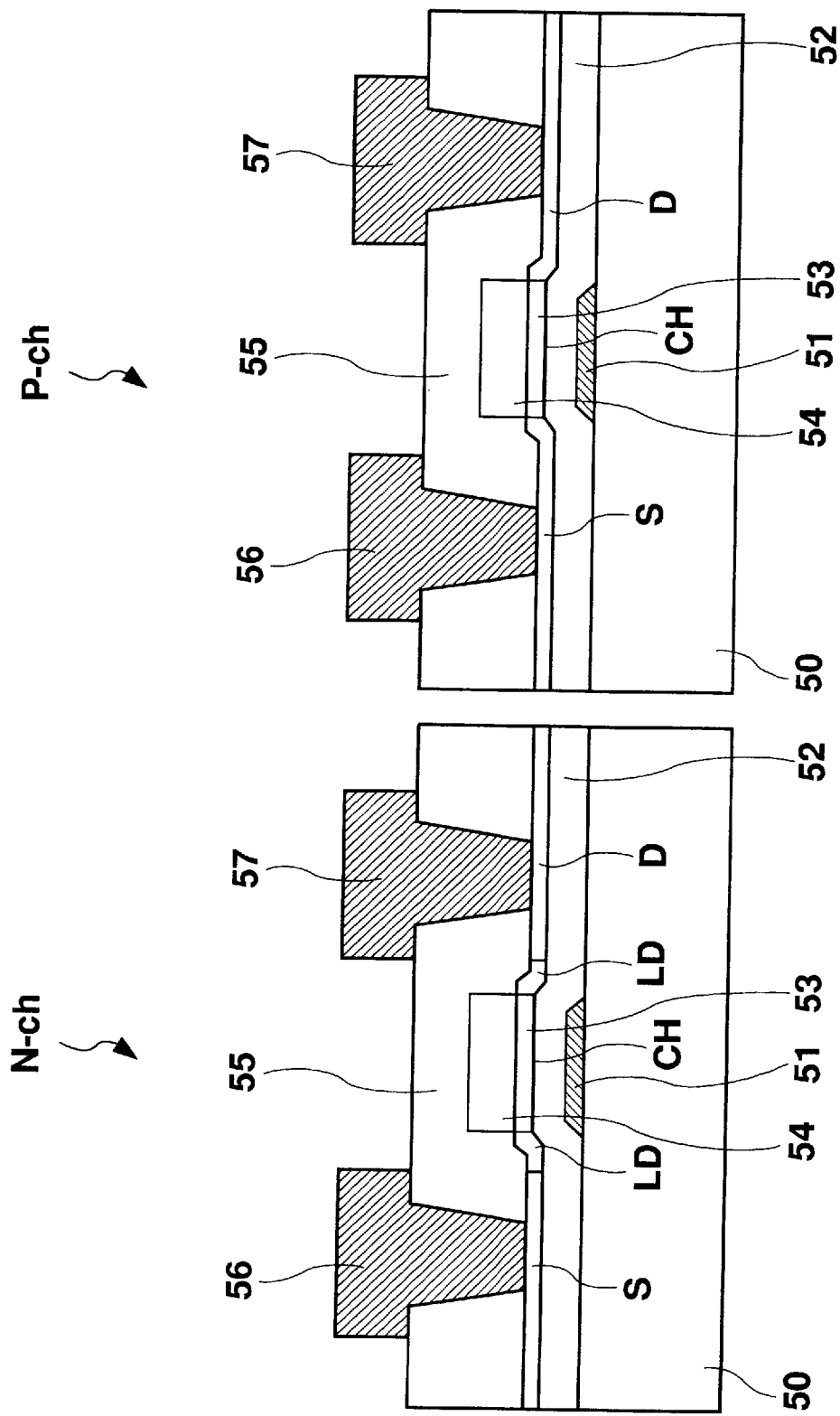
FIG. 1 is a block diagram showing a section of a conventional semiconductor.
Figure 2A:
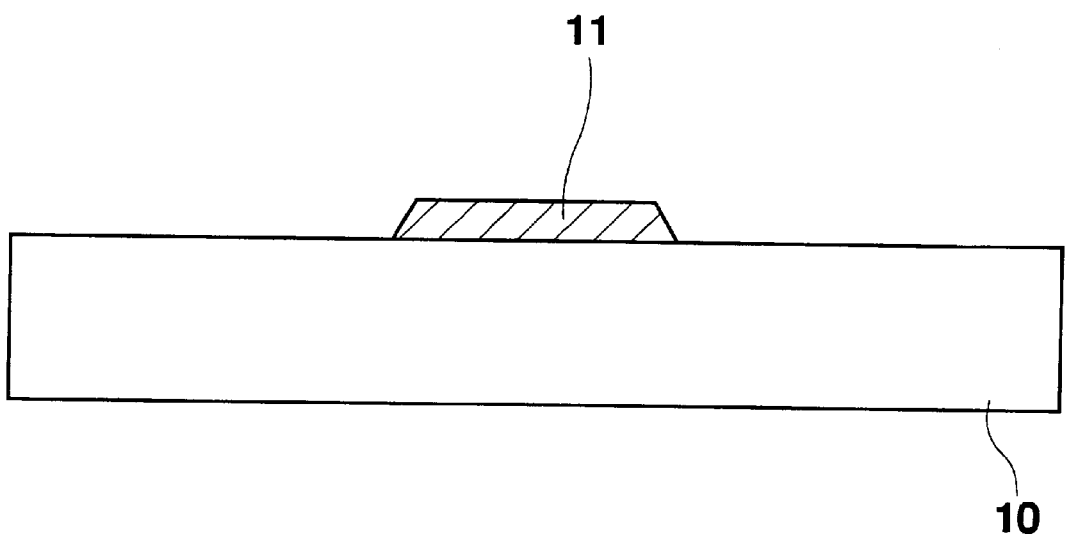
FIGS. 2A, 2B, 2C, 2D, 2E, 2F, 2G, and 2H are flowcharts showing the manufacturing process of a semiconductor according to an Embodiment 1 of the present invention.

At first, in FIG. 2A, a gate electrode 11 is formed by etching a chromium film which is formed to cover a substrate 10 of non-alkaline glass, soda glass, or the like. The gate electrode 11 is formed together with a gate line which is considered as a supply line of scanning signal.

Figure 2B:
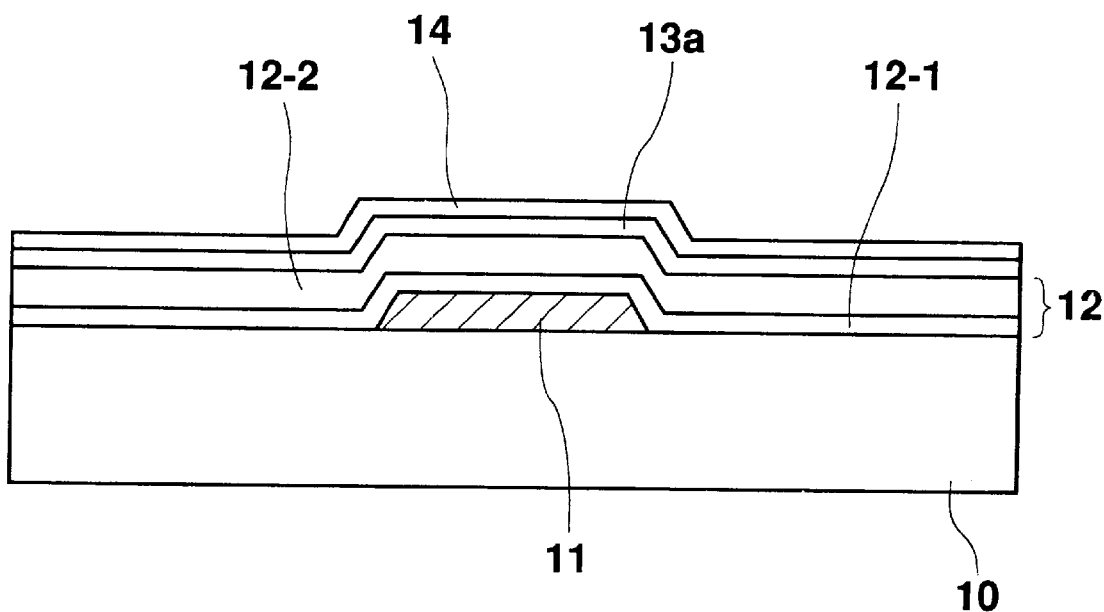

In FIG. 2B, a gate insulating film 12, made of SiNx 12-1 and $SiO_2$ 12-2, is formed over the entire gate electrode 11 by plasma CVD, and successively an amorphous silicon film (a-Si) 13a and a protection film 14 made of $SiO_2$ for protecting the amorphous silicon film (a-Si) 13a are formed without breaking the vacuum. The amorphous silicon film 13a is formed by decomposing material gases, such as monosilane SiH, and disilane $Si2H_4$, by heat and plasma.

Figure 2C:
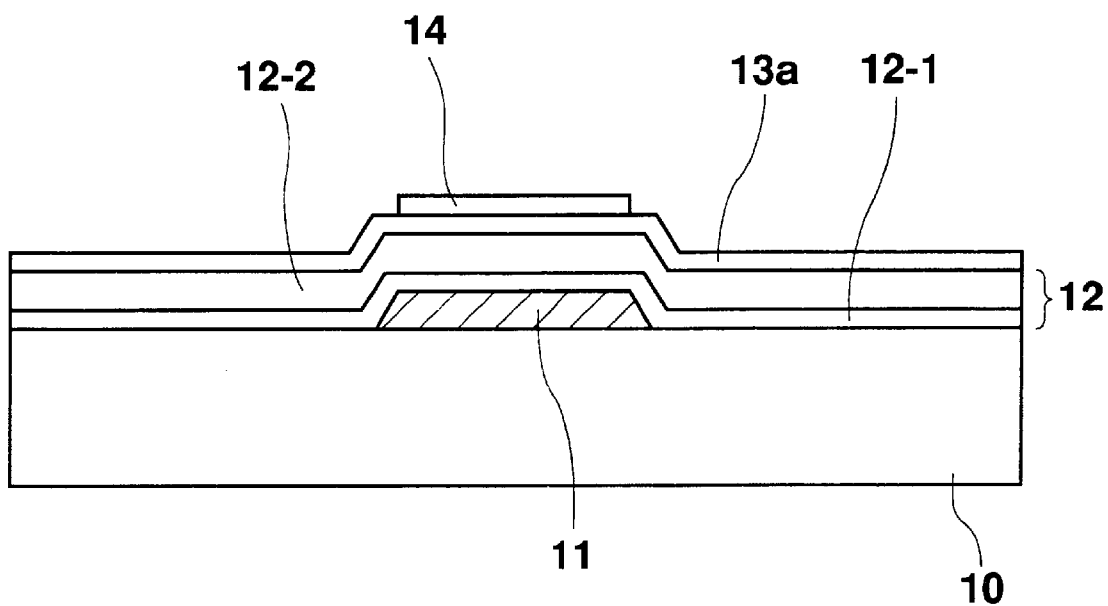

In FIG. 2C, the protection film 14 is formed in shape almost identical to that of the gate electrode 11 through a back-exposure method. That is, positive resist is spread over the protection film 14 and the gate electrode 11 is then projected to the resist with light below the substrate 10 using the gate electrode 11 as a pattern mask, thereby exposing the regions other than the shade of resist gate electrode 11, and reacting to a developer. Then, by etching $SiO_2$ by using the resist as a mask after development, the protection film 14 is left only on the shaded part, namely, the upper part of the gate electrode 11, while the rest is removed. As will be explained later, the exposing light in this process is set relatively weak or exposing time is a relatively short time, and therefore relatively large shade region of gate electrode 11 is exposed. Thus, the protection film 14 is formed larger than an implantation stopper 15, as will be explained later.

Figure 2D:
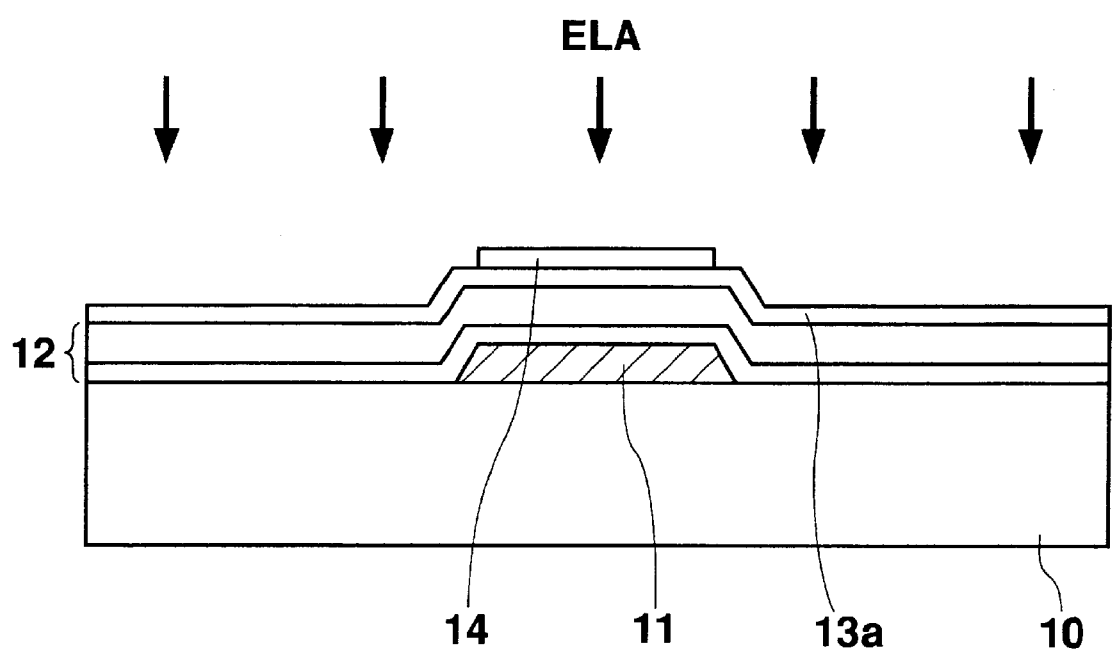

In FIG. 2D, a p-Si 13p film is formed through crystallization of the a-Si film 13a by undertaking excimer laser annealing ELA from the protection film 14 side under the condition that the protection film 14 is formed only over the upper part of gate electrode 11. The treated substrate is taken out to the atmosphere prior to this excimer annealing process, and then processed. During that period, the surface of the a-Si film 13a covered with the protection film 14 is prevented from contamination in the air. Therefore, problems caused by impurity ions in a transistor element leading to changing flat band voltage of transistor with electric potential produced by these electric charges and shifting threshold value in parallel, are prevented. Also, because the a-Si film 13a and the protection film 14 are formed by consecutive CVD, lattice defect on the interface of both layers are minimized and the density of interface state is rendered to be low. As a result, an electrical property of less trap and high ON-OFF ratio can be obtained.

Also, since the protection film 14 is formed by $SiO_2$ having a thickness of 520 Å, the reflectance ratio of laser light on the surface of the a-Si film 13a is set sufficiently low during ELA. The protection film 14 of $SiO_2$ has index refraction larger than the air, but smaller than the a-Si film 13a. As a result, less reflection is made on the surface of this protection film 14 and between upper face and lower face of this protection film 14 the reflection is made plural times. Therefore, when a wave length of laser light is λ, a refractive index of $SiO_2$ is n, and a thickness of protection film is d, then $$4n\, d = \lambda \quad (1)$$

can be set. If λ is 308 nm and n is 1.46, then d=52.7 nm. Therefore, by setting the thickness of protection film 14 as above, the interface in the protection film 14 is strengthened by using the surface of the protection film 14 as a fixed end. As the reflectance ratio on the upper surface of protection film 14 which is made of $SiO_2$ is smaller than that on the surface of the p-Si film 13p, the degree of light radiated to the p-Si film 13p is enhanced by forming the protection film 14 over the p-Si film 13p.

As explained above, where the a-Si film is crystallized under the condition that gate electrode 11 and a gate line connected to the gate electrode 11 coexist and laser annealing in the form of line or sheet beam (rectangular) is applied, energy is diffused to other regions along with the gate electrode 11 and the gate line which have higher thermal conductivity, and energy declines only over the gate electrode 11 and the gate line, thereby rendering the grain size of the p-Si film 13p to be smaller than in other regions. As a result, as in Embodiment 1, because there is anti-reflection function and the heat capacity becomes bigger, by forming the protection film 14 on the gate electrode 11 and the gate line, the increase of absorption of laser light by the protection film 14 and diffusion of energy along with the gate electrode 11 and its line are offset each other, which enables to conduct homogeneous laser annealing over the entire surface.

In this laser annealing, hydrogen contained in the a-Si film 13a in abundance flows out. However, since the protection film 14 is formed only over the channel region CH, the hydrogen escapes from the side of the protection film 14. In other words, if the protection film 14 is formed to cover the entire surface, there will be a problem such that hydrogen gets into the protection film 14 on the way of the escape to cause lattice defects on the interface between the p-Si film 13p and the protection film 14 which is now in a good condition.

Figure 2E:
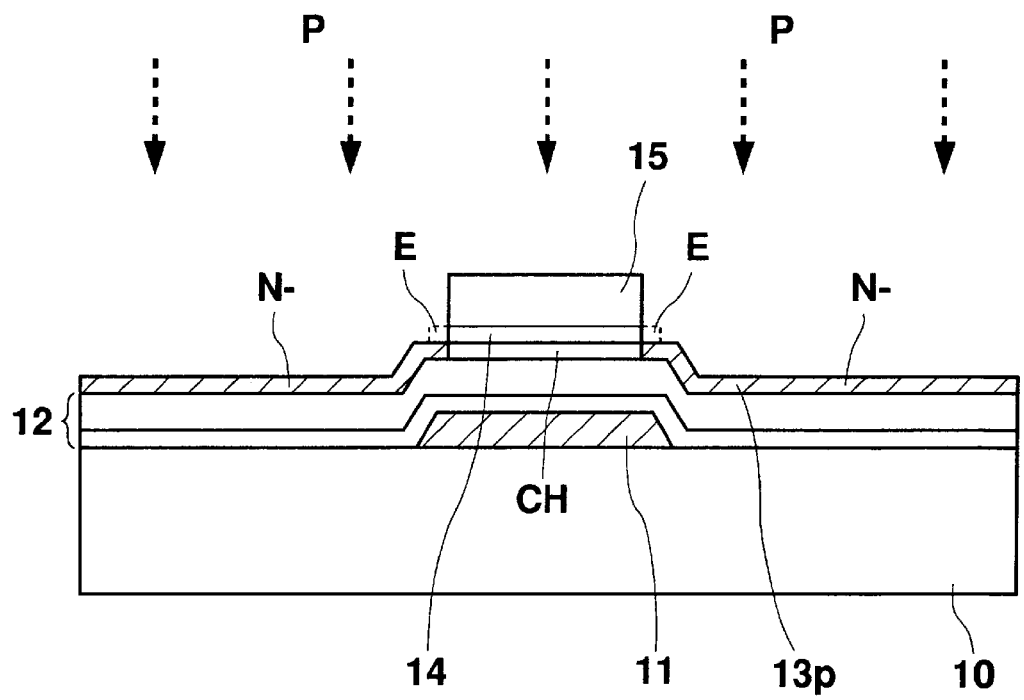

In FIG. 2E, the substrate where the p-Si film 13p is formed is filmed with $SiO_2$. An implantation stopper 15 is formed above the gate electrode 11 like protection film 14 by etching $SiO_2$ with the back-exposure method as in the process shown in FIG. 3. The exposure at this time is performed using stronger light for a longer period of time than that of the process in FIG. 2C. Resist is exposed so as to make a shaded region of the gate electrode 11 small by sufficiently utilizing the diffraction effect of light. That is, an implantation stopper 15 is formed smaller than the pattern of the protection film 14. Further, the protection film 14 is reformed so as to have the same configuration as that of the implantation stopper 15 by etching the projected part E of the protection film 14 made of $SiO_2$, when the implantation stopper 15 is etched.

Regions other than implantation stopper 15 are lightly doped with N- by applying to the p-Si film 13p an ion implantation of phosphorus P which shows N-type conductivity with the low dose volume of approximately $10^{13}$ using the implantation stopper 15 as a mask. At this point, the directly under part of the implantation stopper 15, that is, the region exactly above the gate electrode 11 is maintained as an intrinsic layer to become a channel region CH for a TFT. Resist used at forming the implantation stopper 15 is maintained at the time of ion implantation but can be taken away after that.

In this case, both edges of the channel region CH protected by the protection film 14 prior to second etching will protrude from the region covered with the protection film 14 when the implantation stopper 15 is formed and at the same time the edges of the protection film 14 are etched. As its edge is determined based on the edges of the implantation stopper 15 and the protection film 14, the lightly doped region N- of the p-Si film 13p is formed adjacent to the channel region CH without deviating from the channel region CH with a quality film.

Generally, mobile ions and interface state in the channel region CH have an influence upon threshold properties of a TFT, whereas the concentration of impurity ions greatly influences electric resistance in the LD region LD and the source and drain regions S and D. Therefore, by including edge of regions covered with the protection film 14 into the LD regions LD, elements with quality electric characteristic can be obtained.

Figure 2F:
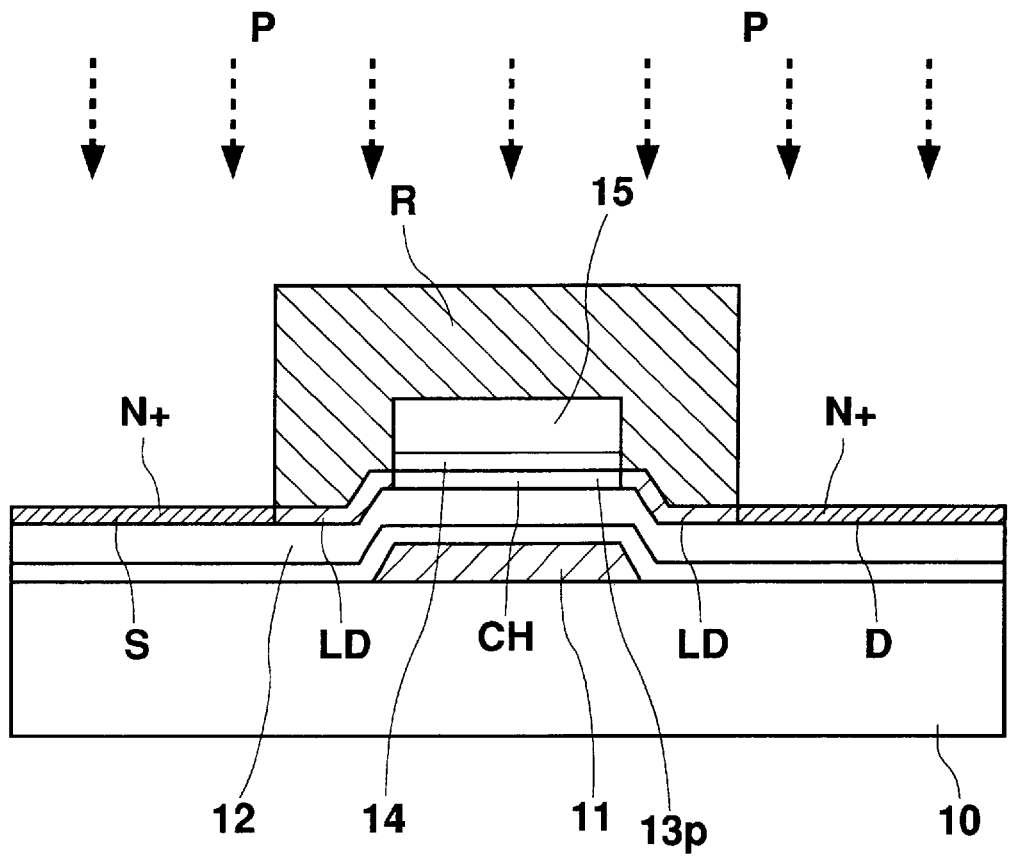

In FIG. 2F, resist R which is bigger than the gate electrode 11 at least in the longitudinal direction of the channel is formed. Using this as a mask, ion doping of phosphorus P is applied to the p-Si film 13p with a high dose volume of about the $10^{15}$. Phosphorus heavily dopes N+ to the regions which are not covered with resist R. Here, in the region directly below the resist R, a lightly doped region N- and the channel region CH are maintained. Thus, there is provided LDD structure in which heavily doped source and drain regions S and D are arranged in such a manner that each of two lightly doped LD regions LDs is sandwiched between the channel region CH and either one of the source and drain regions.

After removing resist R, activation annealing, such as, heating or laser radiation is undertaken with the objective of recovering crystallization of the p-Si film which has under gone doping of impurity ions and for lattice substitution of impurities.

Subsequently an island pattern is formed by etching the p-Si film 13p so that only the regions necessary for the TFT remain.

Figure 2G:
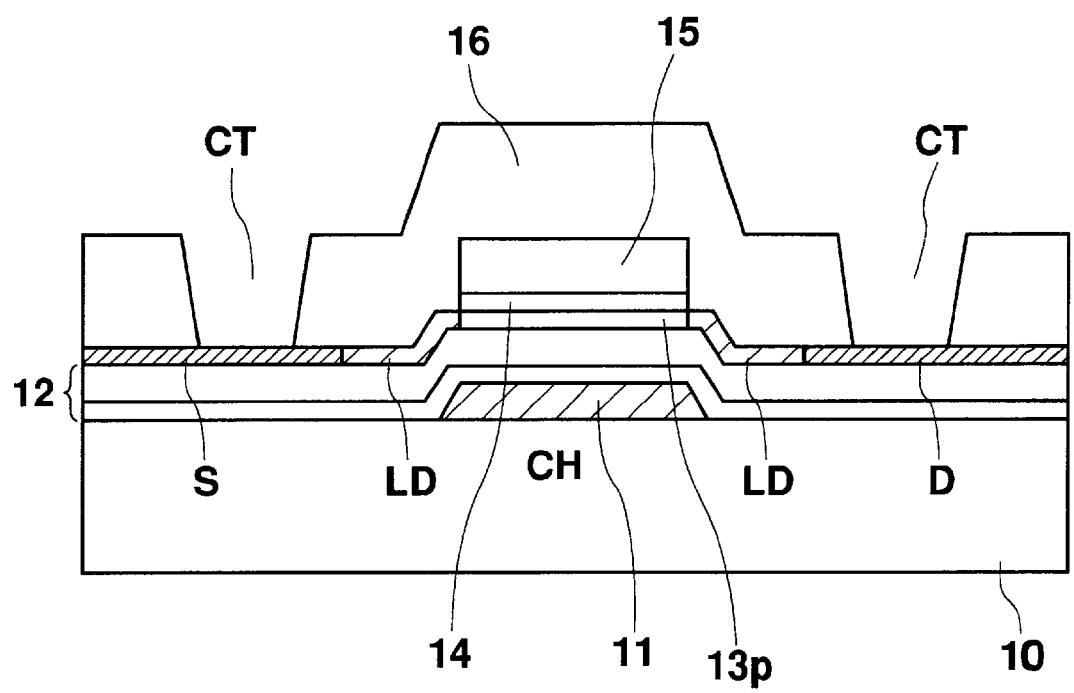

In FIG. 2G, an interlayer insulating layer 16 made of SiNx or the like is formed. Contact holes CTs are formed by eliminating the parts corresponding to the source and drain regions through etching, and a part of the p-Si film 13p is exposed.

Figure 2H:
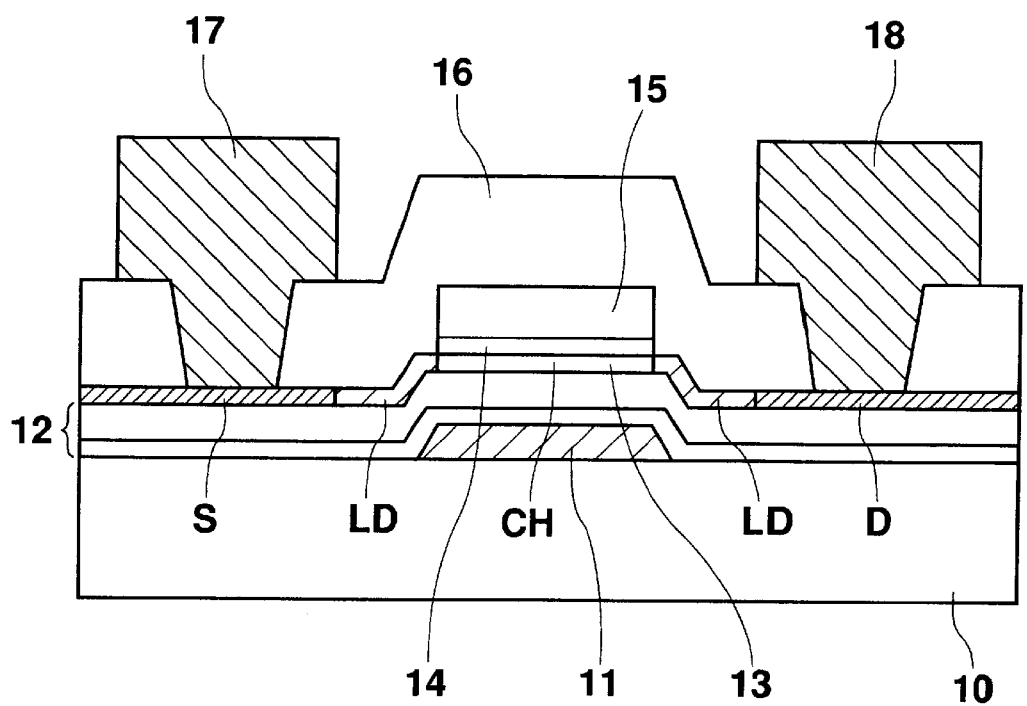

In FIG. 2H, the TFT is completed after forming a source electrode 17 connected to a source region S via the contact hole CT and a drain electrode 18 connected to a drain region D via the contact hole CT by placing films of Al, Mo or the like and etching them.

In manufacturing a semiconductor device in which an electrode and a semiconductor layer are formed on a substrate, by having a structure that an insulating film continuously formed is arranged on both upper and lower sides of the semiconductor layer to be an active layer, a lattice condition of the interface between the semiconductor layer and the insulating film becomes satisfactory and the active layer of the semiconductor layer will not be exposed. Therefore, contamination of the surface is prevented and a semiconductor element having quality electrical characteristic can be obtained.

Embodiment 2

The structure of a semiconductor device and the manufacturing method according to an Embodiment 2 of the present invention will next be explained. As explained in the Embodiment 1, the channel region of a thin film transistor is formed within the p-Si film 13P obtained through polycrystallization of the a-Si film 13a by laser annealing. A SiNx layer 12-1 and a $SiO_2$ layer 12-2, which together compose a gate insulating film 12 as shown in FIG. 2B, and the a-Si film 13a are successively formed by plasma CVD. For example, in manufacturing LCD panels, thin film transistors for a plurality of LCD panels are simultaneously formed over a single glass substrate (mother substrate). Development of a large-sized LCD panel is progressing, as is development of a large-scaled mother substrate on which a plurality of LCD panels are simultaneously formed. As mother substrates become bigger, uneven CVD filming of above-mentioned gate insulating film and the a-Si film 13a formed on the substrate becomes more likely to occur. The uneven filming of plasma CVD film formed by plasma CVD cannot be avoided due to the discharge distribution of electrodes, distribution of material gases and thermal distribution in the chamber of a CVD unit. Uneven distribution introduces the possibility of reappearance within the mother substrate.

Figure 3:
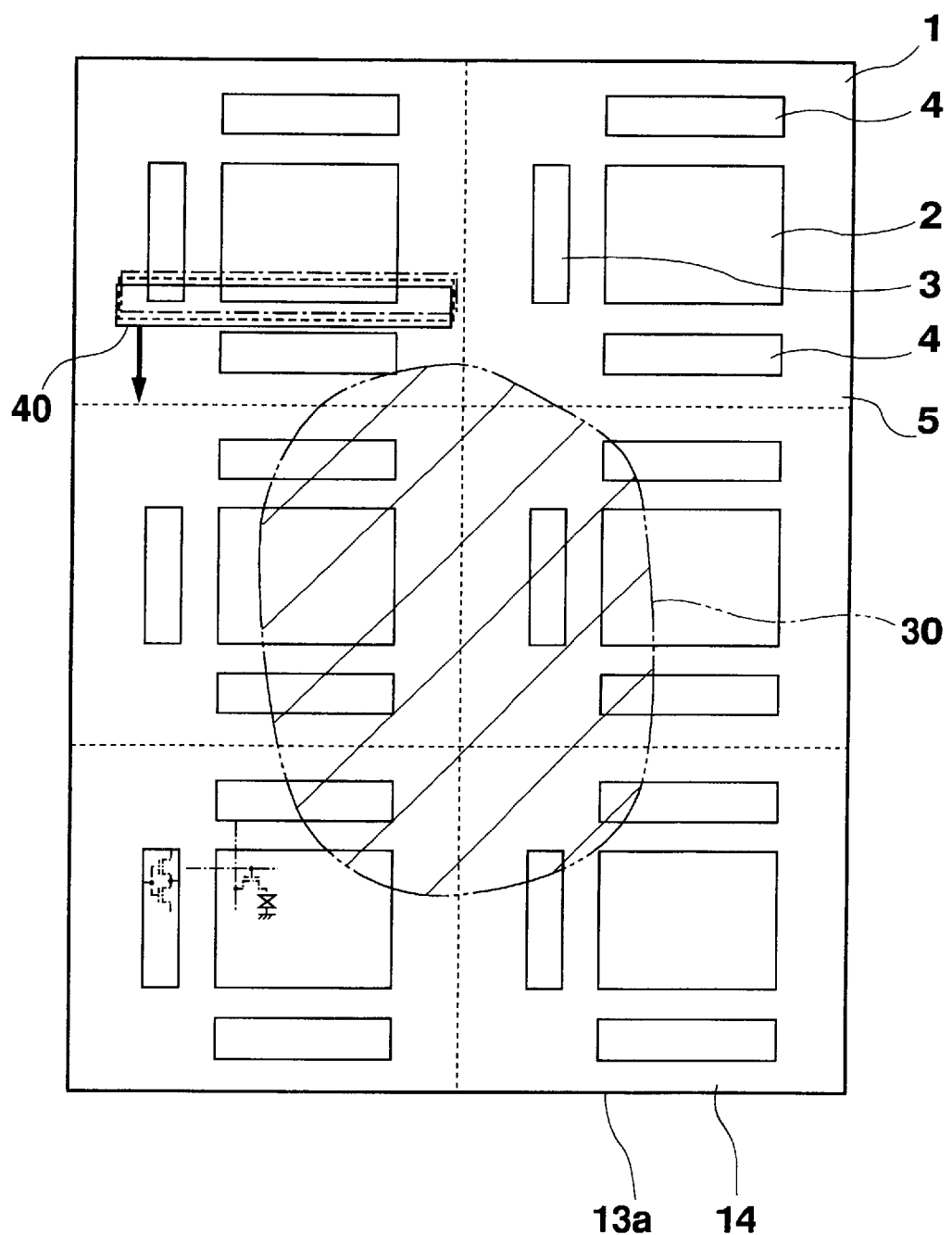
FIG. 3 is a conceptual drawing which shows a state of each section on a substrate processed during polycrystallizating and annealing process in a manufacturing method according to the present invention.

FIG. 3 is a plan showing a substrate 1 to be treated, which in this case is the mother substrate in the ELA process described in FIG. 2D. More specifically, the substrate 1 to be treated is a substrate of non-alkaline glass 10 or the like on which the a-Si film 13a and the protection film 14 are formed. Substitute 1 contains six LCDs 5, each of which consists of a display picture element section 2 in which a matrix of pixels are to be arranged and a gate driver 3 and drain drivers 4 both of which are to be arranged around the display picture element section 2. At the display picture element section 2, the matrix of TFTs are arranged. Each of the TFTs is connected to either one of the electrodes of a pixel capacitor for driving liquid crystal. Among the TFTs to be completed later, gate electrodes 11 of the TFTs which are arranged in a horizontal line in the drawing are connected to the same gate line, while drain electrodes 18 of the TFTs which are arranged in a vertical line in the drawing are connected to the same drain line. The gate driver 3 mainly consists of shift resisters, and the drain drivers 4 mainly consist of shift resisters and sampling circuits. These drivers are composed by CMOS which consists of N-ch and P-ch TFTs.

ELA radiation of a pulse laser forms a wide beam. By gradually shifting a wide beam with a rectangular edge line represented by numeral 40 in FIG. 3, annealing is applied to the entire surface.

As described above, the a-Si film 13a and the protection film 14 formed by plasma CVD respectively each have their own particular unevenness of the film thickness. For example, if in one CVD unit, the a-Si film 13a is disposed thicker in the region 30 enclosed with double broken lines in FIG. 3 and in the remaining region the film 13a is disposed thinner, even if ELA is evenly performed over the entire substrate 1 to be treated, the given energy density in the region 30 where the a-Si film 13a is thick is lower than that in regions where the film is thin. If the given energy density differs, grain size of the p-Si film 13p will also differ. As shown in the drawing, if the grain size of the p-Si film 13p varies with each LCD region 5, the electrical characteristic of the TFT are uneven, the brightness and contrast ratio in the display picture element section 2 is uneven spread, and drivers 3 and 4 are likely to malfunction.

Therefore, in this embodiment 2, by controlling the thickness of the protection film 14, uneven radiated laser energy per unit area of the a-Si film 13a caused by uneven thickness of the a-Si film 13a is controlled so that the effective energy supplied to the a-Si film 13a in all regions of the treated substrate 1 is even.

Practically, considering reappearance in unevenness of thickness of the film made by plasma CVD, regions where the a-Si film 13a is thickest are searched in advance. If the region 30 in FIG. 3 is the concerned region, protection film 14 will be formed on the a-Si film 13a so that the thickness of protection film 14 in region 30 of FIG. 3 will be of optimum thickness based on the aforementioned equation 1.

For example, although the thickness of the a-Si film 13a is set at 400 Å, the thickness of the a-Si film 13a actually formed on the substrate 1 is 440 Å in the thickest region 30. Therefore, in the region 30, the protection film 14 with a thickness according to the equation 1, which provides the greatest supply efficiency of energy radiated by laser light to the a-Si film 13a, is formed; e.g., a thickness of about 520 Å. Here the thickness of protection film 14 varies as does the thickness of the a-Si film 13a over the entire surface of the substrate 1 (in many cases the unevenness will have some similarity) since the protection film 14 (SiNx) is formed by plasma CVD same as forming the a-Si film 13a. Thus, when the optimum thickness of the protection film 14 is formed, the thickness of the protection film 14 differs from the optimum value of the equation 1 in other regions than the concerned region 30. If a protection film 14 of other than optimum thickness is formed, laser light interfere with each other within the protection film 14 and are weakened.

Therefore, in regions where the a-Si film 13a is deposited thickly, the radiated laser energy is efficiently supplied to the a-Si film 13a due to the presence of the protection film 14 with the optimum thickness. On the other hand, in regions where the a-Si film 13a is thinly deposited, the radiated laser energy is weakened and supplied to the a-Si film 13a because the protection film 14 is not of optimum thickness. As a result, high energy is supplied in regions where the density of given energy is small due to the a-Si film 13a being thick, while less energy is supplied in regions where the density of given energy is large due to the thin a-Si film 13a. As laser annealing is uniformly applied to the entire region, lessening the unevenness of given energy density due to the uneven thickness of the a-Si film 13a, homogeneous p-Si film 13p can be obtained. The other structure and manufacturing process correspond to those of Embodiment 2 described above.

Embodiment 3

In Embodiment 3, the unevenness in supply efficiency of radiated laser to the a-Si film 13a caused by the unevenness of thickness of the a-Si film 13a formed by plasma CVD, is lessened by controlling the thickness of the protection film 14, similarly to Embodiment 2. The difference from Embodiment 2 is that the unevenness of thickness of the a-Si film 13a is taken into consideration in Embodiment 2, whereas the unevenness of thickness of the gate insulating film 12 is considered in Embodiment 3. SiNx layer 12-1 and SiO$_2$ layer 12-2, which compose the gate insulating film 12 as shown in FIG. 2B, are formed by plasma CVD like the a-Si film 13a, and film thickness varies from place to place in the entire region of the substrate 1 to be treated as shown in FIG. 3.

For example, if the thickness of the gate insulating film 12 varies within the substrate 1 to be treated, the effective energy for crystallization of the a-Si film 13a differs because of diffusion of heat along with the gate electrode 11 and the gate line connected to it when the a-Si film 13a is polycrystallized by ELA. More specifically, when the a-Si film 13a is polycrystallized by radiating laser light in the structure where the gate electrode 11 and its gate line are placed under the a-Si film 13a sandwiching the gate insulating film 12, thermal diffusion of the radiation energy arises consecutively along the gate electrode 11 and gate line, which is a lower layer of the a-Si film 13a. The thicker the gate insulating film is, the larger the thermal capacity is due to the existence of this gate insulating film 12, and thermal diffusion therefore becomes more difficult. On other hand, for thinner films, thermal diffusion is easier. Therefore, grain size of the p-Si 13p varies within the same substrate according to the inclination of thickness of the gate insulating film 12.

Therefore, in Embodiment 3, the unevenness of radiated laser energy per unit area of the a-Si film 13a, caused by uneven thickness of the gate insulating film 12, is absorbed by controlling the thickness of the protection film 14. The energy is controlled so as to be evenly supplied to the a-Si film 13a over the entire region of the substrate to be treated.

Practically, considering the reappearance in unevenness of film thickness formed by plasma CVD, regions where the gate insulating film 12 is thinnest are searched for in advance. If the region 30 in FIG. 3 is the concerned region, the protection film 14 is formed on the a-Si film 13a so as for the protection film 14 formed over the region 30 to have optimum thickness according to equation 1 above.

For example, in Embodiment 3, the thickness of the gate insulating film 12 is set to 1800 Å totaling 500 Å of the SiNx film 12-1 and 1300 Å of the SiO$_2$ film 12-2. However, the actual thickness of the gate insulating film 12 formed over the substrate to be treated totals 1600 Å, made up of 450 Å of the SiNx film 12-1 and 1150 Å of the SiO$_2$ film 12-2 in the region 30 in which the thinnest gate insulating film is formed. Thus, the protection film 14 which has a thickness according to the equation 1 that supply efficiency of radiated energy by laser light to the a-Si film 13a becomes maximum is formed in the region 30. Here, since the thickness of the protection film 14 unevenly spreads as the thickness of the gate insulating film 12 varies in the entire regions of the substrate 1 to be treated, the thickness of protection film 14 in regions other than the concerned region 30 differs from the optimum value in equation 1. If the thickness of the protection film 14 is not optimum, laser reflection light in the protection film 14 interferes with itself and weakened.

Therefore in the region where the gate insulating film 12 is thinly deposited, radiation laser energy is efficiently supplied to the a-Si film 13a because the protection film 14 is of optimum thickness. However, in regions where the gate insulating film 12 is thick, the radiation laser energy is weakened because the thickness of the protection film 14 is not optimum, and supplied to the a-Si film 13a.

As a result, higher energy is supplied where effective energy is weak due to the thin gate insulating film 12, while lower energy is supplied where effective energy is strong due to the thick gate insulating film 12. By lessening the unevenness of thermal capacity resulting from uneven thickness of the gate insulating film 12, laser annealing is uniformly applied to the entire region, and a homogeneous p-Si film can be obtained.

Other construction and manufacturing processes of Embodiment 3 correspond to those of Embodiment 1 described above.

In the above explanation, an example was described in which the region where the gate insulating film 12 is thinnest is the region 30 in FIG. 3. However, if the gate insulating film 12 becomes thicker, and films of other regions become thinner, the protection film 14 with the optimum thickness is formed in the region, where the gate insulating film 12 becomes thinner.

For example, in a case in which a thick a-Si film 13a is formed in the region 30 as in Embodiment 2, there possibility that the gate insulating film 12 formed by similar plasma CVD will also be thick increases. In such a case, to remove a portion of the increase of energy efficiency caused by the presence of the thick gate insulating film 12, the thickness of the protection film 14 in the region 30 is set to the relevant value according to the volume of radiated laser energy actually attributed from the concerned gate insulating film 12 and given to the thick a-Si film 13a. Therefore, the thickness of the protection film 14 in the region 30 is adjusted so as to have a film thickness satisfying equation 1 as an upper limit.

In the case of a bottom-gate-type thin film transistor as described in the embodiment 3, although the grain size of the p-Si film 13p laser-annealed depends on both thickness of the a-Si film 13a and thickness of the gate insulating film 12, the change rate in electrical characteristic is not proportional to the change rate of each film thickness. Therefore, unevenness of electrical characteristic is not completely offset, even if the thicknesses of the a-Si film 13a and the gate insulating film 12 are equally distributed. Unevenness of electrical properties appears according to the unevenness of thickness which has a greater influence on electrical characteristic.

Thus, in Embodiment 2, the thickness of the a-Si film 13a has a bigger influence on electrical properties (machinery, facility, etc.) and in this Embodiment 3, the thickness of the gate insulating film 12 has a bigger influence (machinery, facility, etc.).

Embodiment 4

Figure 4A:
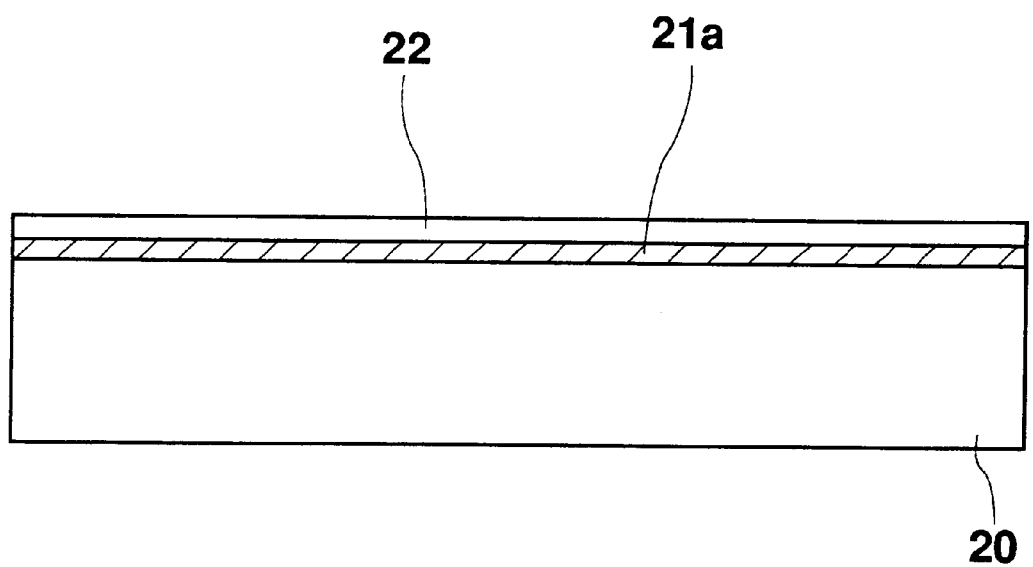
FIGS. 4A, 4B, 4C, 4D, 4E, 4F, 4G, 4H, and 4I are flowcharts showing a manufacturing process of a semiconductor device according to an Embodiment 4 of the present invention.

An Embodiment 4 of the present invention will next be explained. FIGS. 4A–4I are sections showing the manufacturing process of Embodiment 4. In Embodiment 4, an example of a top-gate type thin film transistor in which a protection film is provided is shown. In FIG. 4A, an a-Si film 21a and a protection film 22 of SiO$_2$ with respective thicknesses of 500 to 600 Å are formed by plasma CVD over a substrate 20 formed of non-alkali glass, soda glass, or the like. At that time, the a-Si film 21a and the protection film 22 are successively formed without any breaking of vacuum.

Figure 4B:
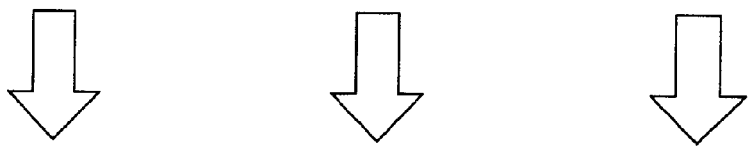
Figure 4B:
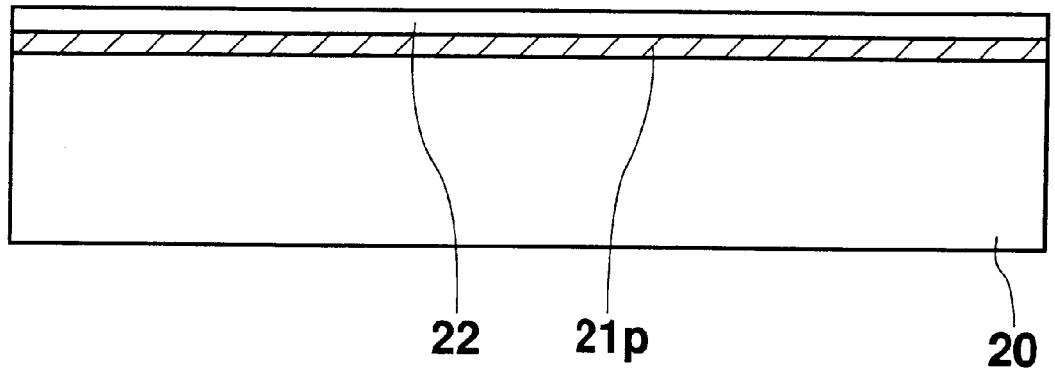

FIG. 4B shows how a p-Si film 21p is formed by polycrystallizing the a-Si film 21a through ELA. Here, the treated substrate 20 is exposed to the atmosphere and sent to the ELA process. Since the surface of the p-Si film 21p is covered with the protection film 22 similar to the process in FIG. 2D of the aforementioned Embodiment 2, the p-Si film 21p is protected from exposure to the atmosphere, which may cause contamination, and the lattice defect on the interface is minimized.

Figure 4C:
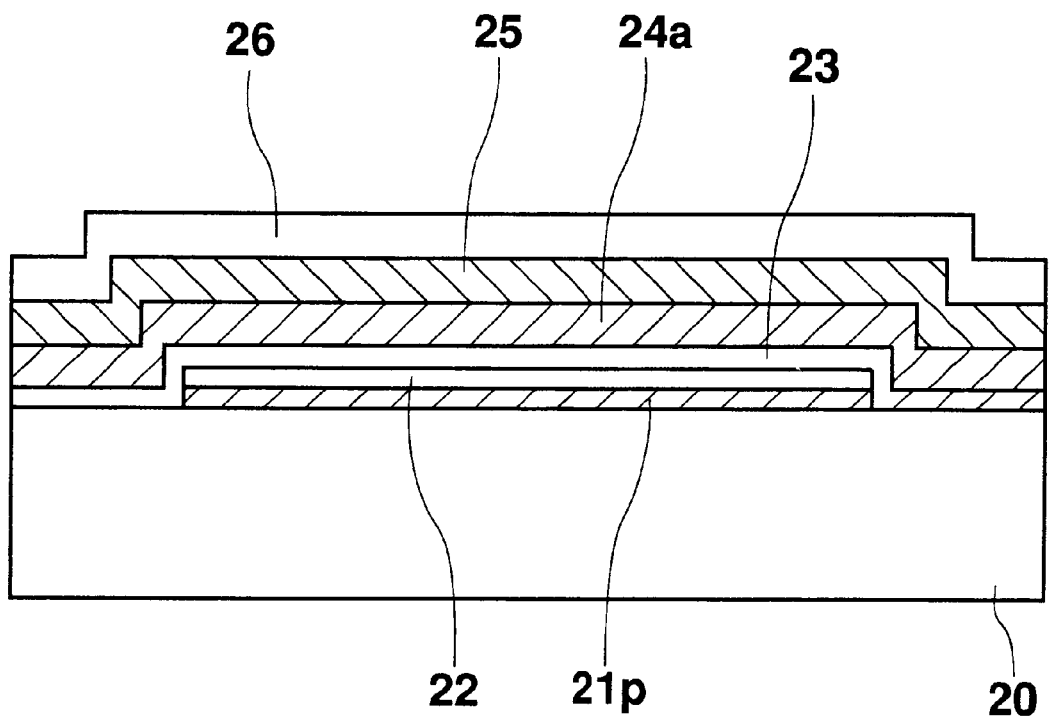

In FIG. 4C, after patterning the p-Si film 21p and the protection film 22 into an island shape required for the TFT through reactive ion etching (RIE) or the like, a low temperature oxide (LTO) film 23 with a thickness of 1000 to 1500 Å which becomes a gate insulating film composing two layer insulating films together with the protection film 22 is formed by 400° C. low pressure CVD, and subsequently polycide which becomes a gate electrode is deposited. More specifically, a doped a-Si 24a with a thickness of 2000 Å is deposited by 450° C. low pressure CVD or the like, and subsequently a tungsten silicide WSix film 25 with a thickness of 1000 Å is deposited by sputtering. Here the a-Si film 24a, which will become a doped p-Si film 24 later by crystallization annealing, forms, together with the WSix film 25, polycide which will become a gate electrode and its interconnecting. N-type impurities are doped at the time of filming, or later.

SiO$_2$ which will become an implantation stopper 26 is further formed on the WSix film 25 by 430° C. CVD.

Figure 4D:
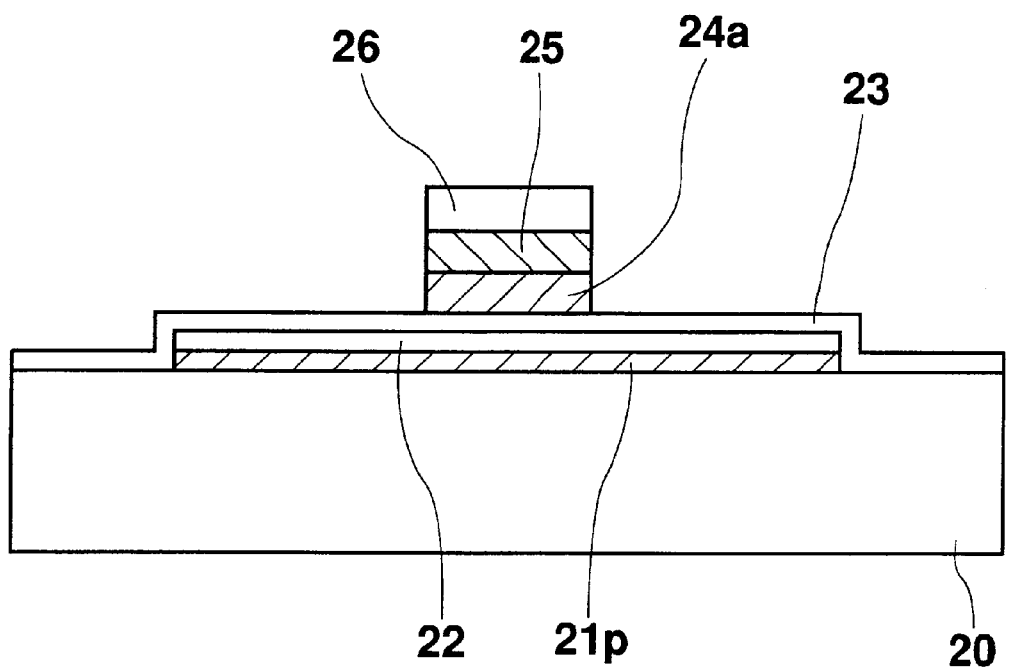

By patterning the implantation stopper 26, the WSix film 25, and the a-Si film 24a into the same shape by RIE as shown in FIG. 4D, the gate electrode and its interconnection are formed, and an implantation stopper is then formed over them.

Figure 4E:
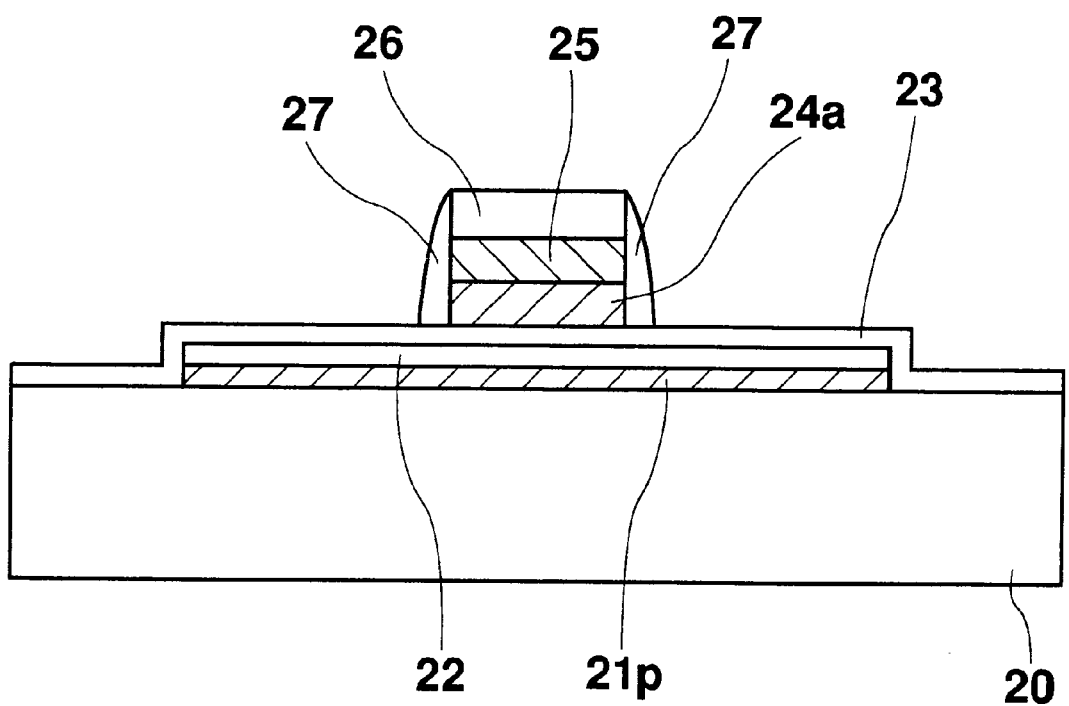

In FIG. 4E, after filming SiO$_2$ by 430° C. CVD, side walls 27 are formed to the side walls of the gate electrodes 24a and 25 and the implantation stopper 26 through entire surface etching by anisotropy etching like RIE.

Figure 4F:
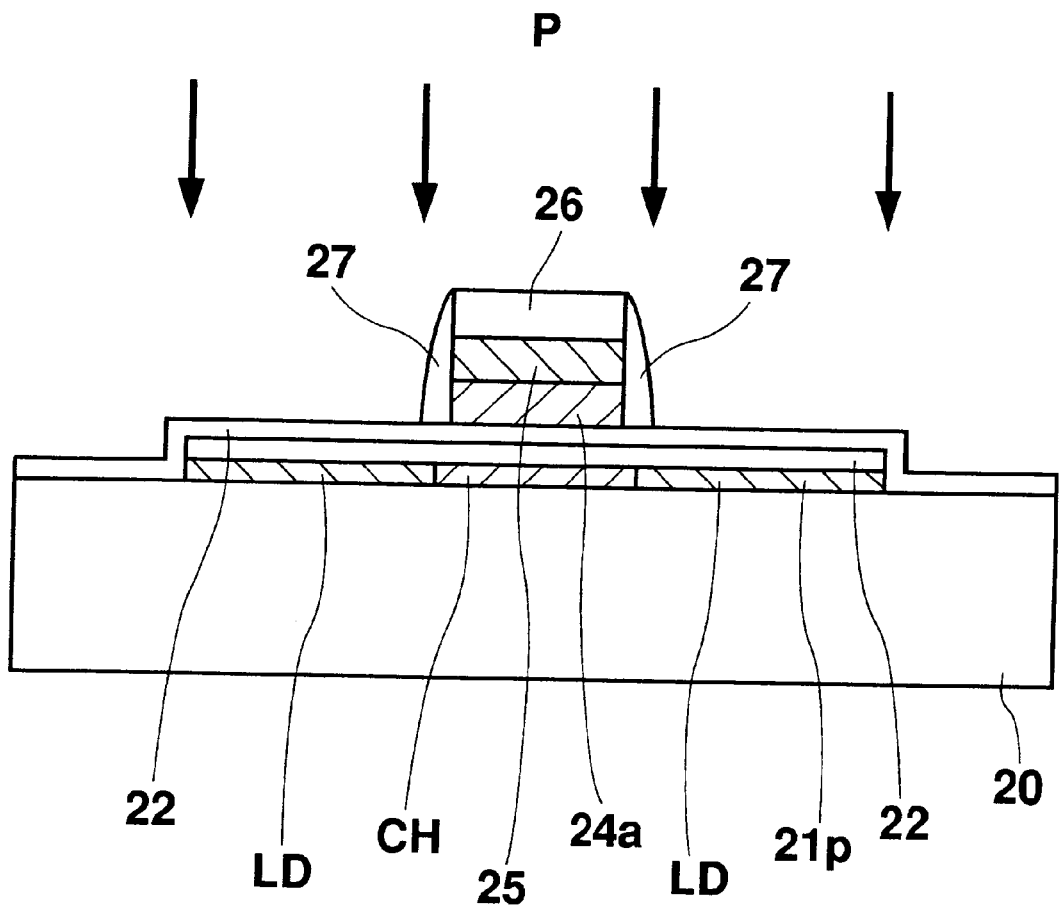

In FIG. 4F, lightly doped LD regions are formed on both sides of a region directly under the gate electrodes 24a and 25 by implantation of phosphorus ions which are n-type impurities at low dose volume to the p-Si film 21 using the gate electrodes 24a and 25 and sidewalls 27 as masks. The sidewalls 27 are used for maintaining the self alignment for lateral diffusion of phosphorus ion in activation annealing to be performed later. The region directly under gate electrodes 24a and 25 becomes a non-doped channel CH region.

Figure 4G:
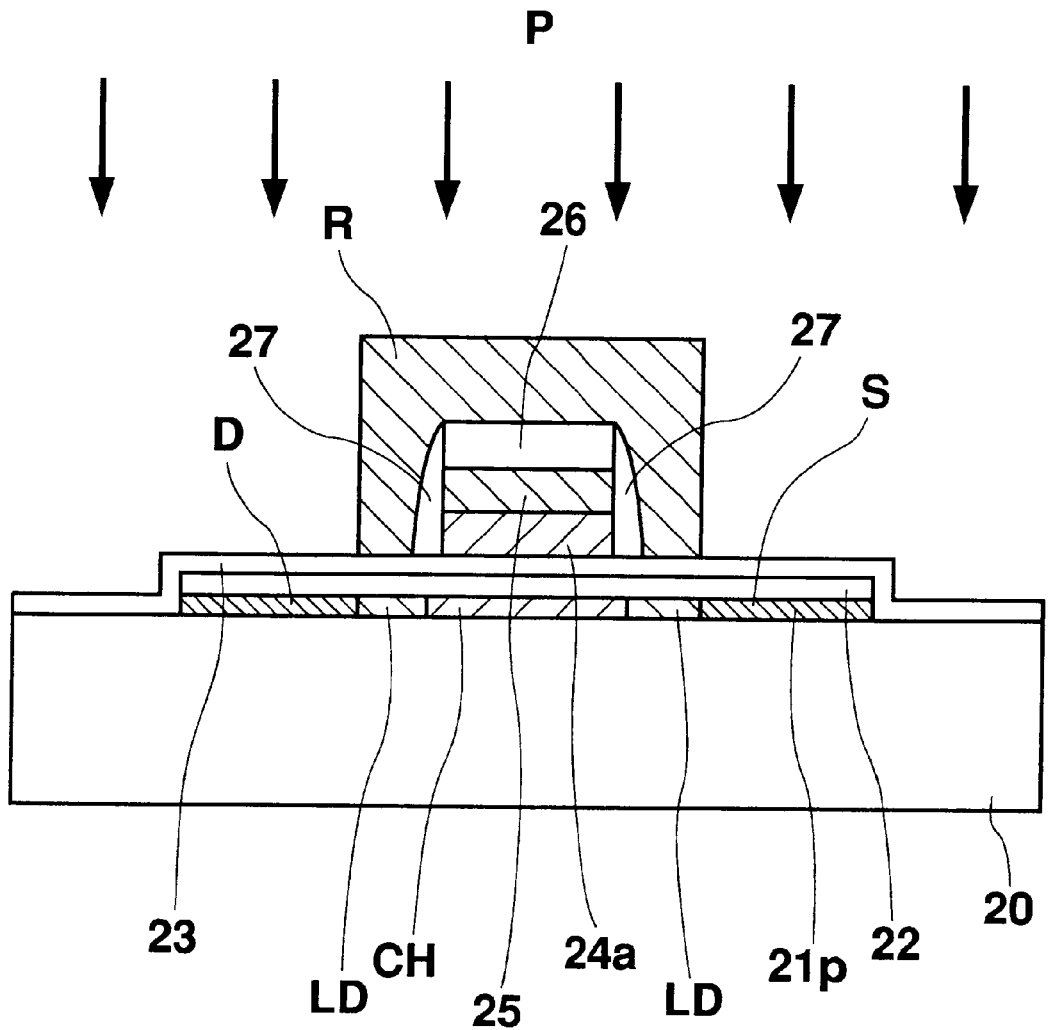

In FIG. 4G, forming the resist R which covers the gate electrodes 24a and 25 and the side walls 27, highly doped drain and source regions D and S are formed by applying ion doping of phosphorus at high dose volume to the p-Si film 21 in use of resist R as a mask. With lightly doped LD regions remaining directly under the resist R, forming these lightly doped LD regions on the both sides of the channel region CH and highly doped drain and source regions D and S on the outside of the LD regions, the LDD structure is completed.

After stripping the resist R, activation annealing of impurities is applied to the entire surface by a rapid thermal annealing RTA method in which rapid scanning is performed placing line lump as a heat source close to the spot to be treated or the ELA method. At the same time, the a-Si film 24a being the lower layer under the gate electrodes is polycrystallized, thereby becoming the p-Si film 24 which has low resistance. The p-Si film 24 together with the WSix film 25 forms a polycide gate having a stack structure. At the same time, lateral diffusion of phosphorus ions doped to the p-Si film 21 occurs. However, as mentioned above, because edges of the LD regions LDs are formed in advance being away from the gate electrodes 24 and 25 due to the presence of sidewalls 27, the edges of the LD regions LDs are expanded and reached just under edges of gate electrodes 24 and 25 due to the aforementioned lateral diffusion, thereby the gate self-alignment is completely carried out.

Figure 4H:
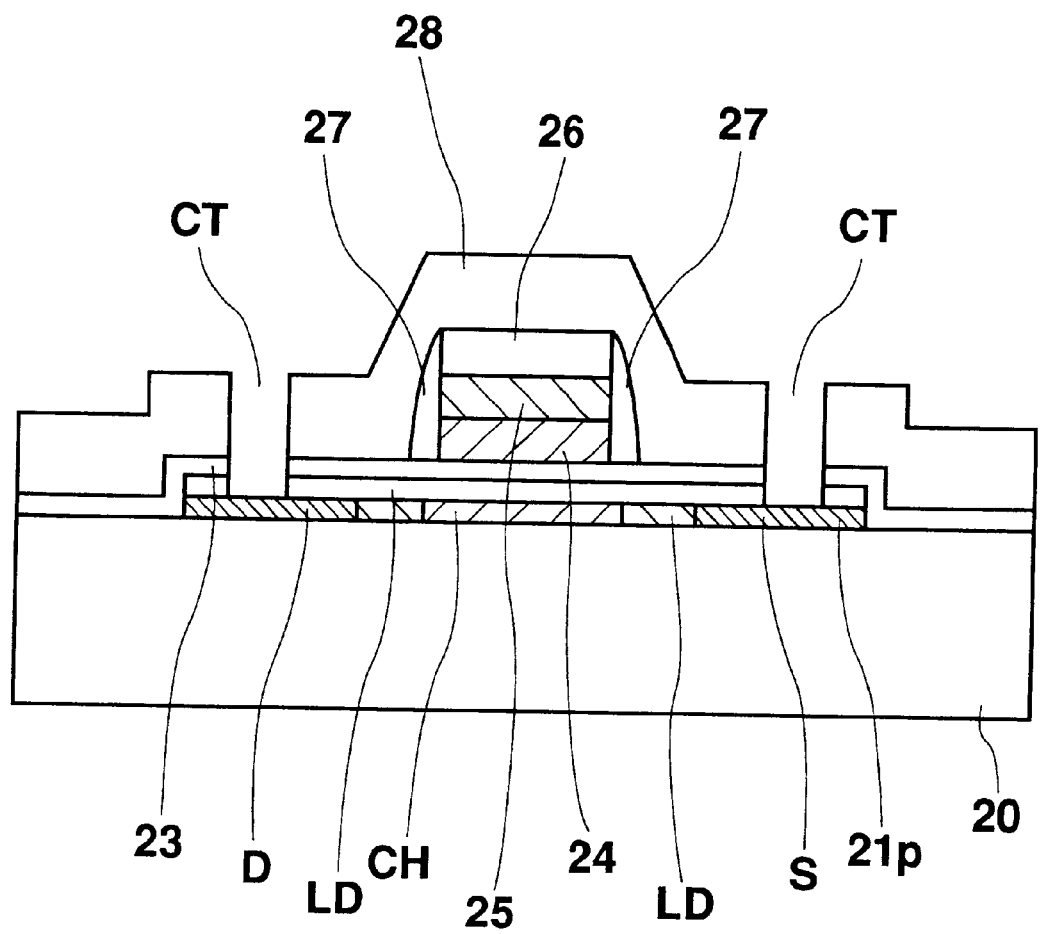

In FIG. 4H, a interlayer insulating film 28 is formed over the entire surface by depositing $SiO_2$ through 430° C. normal atmospheric pressure CVD, and then by depositing $SiO_2$ through 400° C. plasma CVD after annealing at 600° C. Contact holes CTs are made by RIE for the interlayer insulating film 28, the gate insulating film 23, and protection film 22 which are arranged on and above the drain and source regions D and S.

Figure 4I:
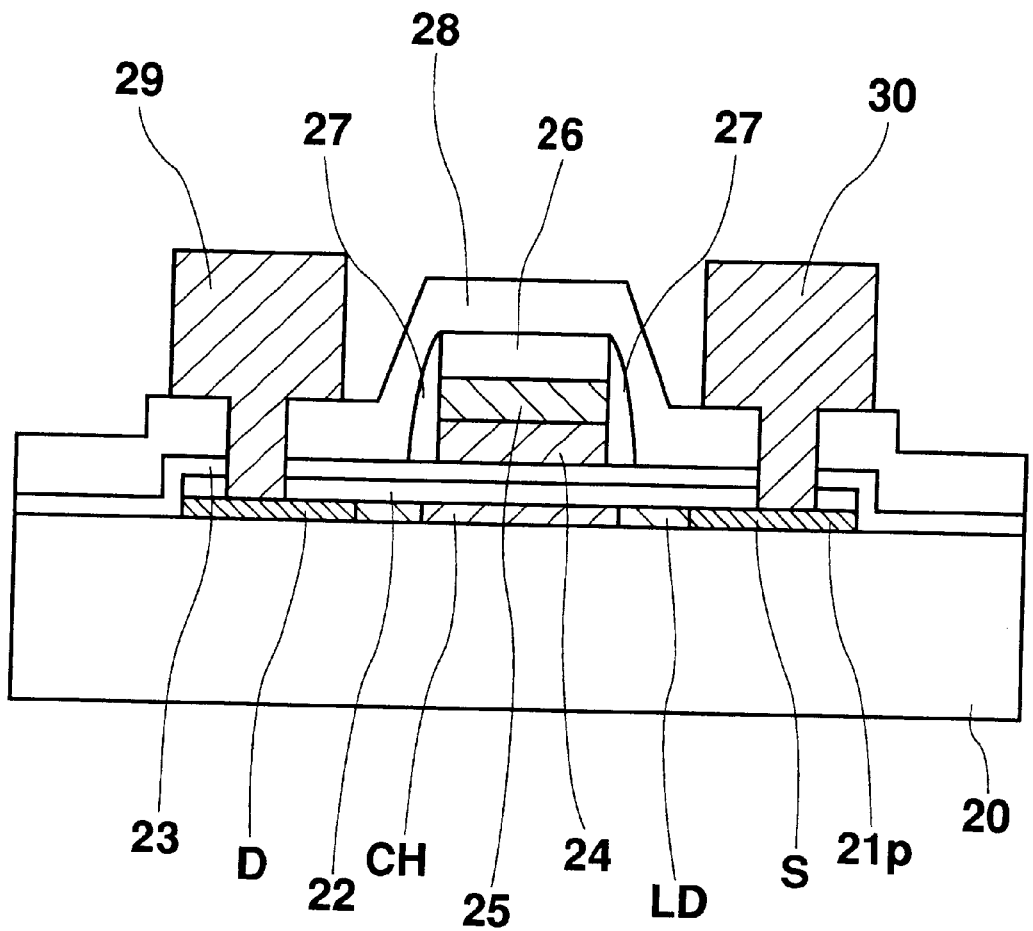

FIG. 4I shows the structure after forming a drain and source electrodes 29, 30, and a Ti/AlSi film with the thickness of 1000 Å/6000 Å made by sputtering on the interlayer 28. Then the Ti/AlSi film is patterned by the RIE process, a drain electrode 29 and a source electrode 30 which will be connected to the drain region D and the source region S through the contact holes CT, respectively, are formed. The TFTs are then completed.

Similar to Embodiments 2 and 3 described above, the thin film transistors formed by the method of Embodiment 4 may be used as driver circuit element and switching element of the display section within a plurality of LCD panel regions on the large substrate 1 to be treated as shown in FIG. 3. Similar with the case of Embodiment 2, the thickness of the a-Si film 21a formed by plasma CVD varies among regions in the entire substrate 1 to be treated in FIG. 3.

Thus, in Embodiment 4, similar to the process in FIG. 2D of Embodiment 2, the protection film 22 is formed in advance such that the thickness of the protection film is optimized according to equation 1 in a region where the a-Si film 21a is formed thickest, for example, the region 30 in FIG. 3. The optimum film thickness may, for example, be about 520 Å. Further, the protection film 22 formed by plasma CVD in the same way as the a-Si film 22a tends to have similar unevenness in thickness to that of the a-Si film 21a. Therefore, if the thickness of protection film 22 is set to be optimum in one region, for example, the region 30, the thickness of the protection film 22 in regions other than the region 30 will deviate from the optimum value to based on equation 1. Thus, in the entire substrate 1 to be treated, the unevenness of actual supply volume of radiated laser energy caused by uneven thickness of the a-Si film 21a is lessened by the thickness of the protection film 22, thereby supplying uniform energy to each a-Si film 21a in the entire substrate. This makes possible formation of a p-Si film 21p that is even over its entire surface.

What is claimed is:

1. A method of manufacturing a semiconductor device in which at least a part of a semiconductor layer is used as a channel region of a semiconductor element, said method comprising the steps of:

forming, on said semiconductor layer, an insulating protection film for protecting said semiconductor layer in such a manner that said semiconductor layer and said protection film are successively formed; and applying annealing to said semiconductor layer such that said protection film covers at least said channel region of said semiconductor layer.

2. The method of manufacturing a semiconductor device according to claim 1, wherein said semiconductor device is comprising said semiconductor layer and an electrode formed on a substrate with an insulating layer between them, and using a region of said semiconductor layer opposite said electrode as said channel region; and said protection film to be formed in succession with said semiconductor layer is formed, with its thickness being optimum for a region in which said insulating layer is formed thickest on said identical substrate.

3. The method of manufacturing a semiconductor device according to claim 1, wherein said semiconductor device is comprising said semiconductor layer and an electrode are formed on a substrate with an insulating layer between them, and using a region of said semiconductor layer opposite said electrode as said channel region; and said protection film to be formed in succession with said semiconductor layer is formed, with its thickness being optimum for a region in which said insulating layer is formed thinnest on said identical substrate.

4. The method of manufacturing a semiconductor device according to claim 1, wherein after removing said protection film with its remainder being left only an channel region which is formed at a location of said semiconductor layer opposite said electrode, annealing is applied to said semiconductor layer.

5. The method of manufacturing a semiconductor device according to claim 1, wherein the annealing applied to said semiconductor layer is laser annealing for polycrystallization of said semiconductor layer which is formed in a state of being amorphous, and laser light is radiated to said semiconductor layer from a side of said protection film formed.

6. The method of manufacturing a semiconductor device according to claim 5, wherein a thin film transistor is formed as a semiconductor element using said manufacturing method, and said thin film transistor is used as a switching element for driving each picture element of a matrix type display unit and/or a switching element of a driver circuit of a matrix type display unit.

7. The method of manufacturing a semiconductor device according to claim 5, wherein a thickness d of said protection film is approximately equal to $\lambda/4n$, where $\lambda$ is the wavelength of the laser light to be radiated and the refractive index n of the protection film is nearly an upper limit.

8. A method of manufacturing a semiconductor device comprising the steps of:

forming a first conductive layer on a substrate and forming a first electrode by patterning said first conductive layer;

forming a first insulating layer in such a manner that said first electrode is covered, forming an amorphous semiconductor layer on said first insulating layer, and further forming an insulating protection film on said amorphous semiconductor layer successively;

patterning said protection film and leaving said protection film only a channel region which is formed at a location of said amorphous semiconductor layer opposite to said first electrode;

forming a polycrystal semiconductor layer by polycrystallization of said amorphous semiconductor layer through annealing applied to said amorphous semiconductor layer such that said protection film remains on said channel region;

forming impurity doped regions on both sides of said active region in said polycrystal semiconductor layer;

forming a second insulating layer, after forming said impurity doped regions, in such a manner that said polycrystal semiconductor layer is covered, and forming openings over said impurity doped regions of said polycrystal semiconductor layer in said second insulating layer; and forming second electrodes, connected with said impurity doped regions, at said openings.

9. The method of manufacturing a semiconductor device according to claim 8, wherein a thickness d of said protection film is approximately equal to $\lambda/4n$, where $\lambda$ is the wavelength of the laser light to be radiated and the refractive index n of the protection film is nearly an upper limit.

10. The method of manufacturing a semiconductor device according to claim 8, wherein said protection film to be formed on said amorphous semiconductor layer is formed so that its thickness is optimum in a region which said semiconductor layer is formed thickest on said substrate.

11. The method of manufacturing a semiconductor device according to claim 8, wherein said protection film to be formed on said amorphous semiconductor layer is formed so that its thickness is optimum in a region which said first insulting layer is formed thinnest on said substrate.

12. The method of manufacturing a semiconductor device according to claim 8, wherein, with said protection film being left on said channel region, a polycrystal semiconductor layer is formed after the annealing and polycrystallization of said amorphous semiconductor; an implantation stop material film is then further formed on an upper part of said polycrystal semiconductor layer on which said protection film is formed, the implantation stopper layer being formed by patterning said implantation stop material film it will be of an almost identical shape to that of said protection film; and, using at least said implantation stopper layer as a mask, impurities are doped to regions on both sides of said channel region in said polycrystal semiconductor layer.

13. The method of manufacturing a semiconductor device according to claim 12, wherein said protection film is left on said amorphous semiconductor layer, after being patterned in advance so that a length of said protection film in channel length direction of said channel region is longer than that of said implantation stopper layer, and, when said implantation stopper layer is formed by patterning said implantation stop material film after annealing is applied to said amorphous semiconductor layer, etching of said protection film in a shape of said stopper layer is simultaneously performed.

14. The method of manufacturing a semiconductor device according to claim 13, wherein patterning steps of said protection film and of said implantation stop material film are respectively done by forming a resist layer on each of said films, exposing said resist layer in regions other than those regions which are to shade said first electrode due to back-exposure such that exposing light radiated from the backside of said substrate, removing exposed regions of said resist layer, and etching said protection film or said implantation stop material film using the remaining resist layer as a mask;

wherein the duration of light exposing from the backside of said substrate is shorter than the duration of exposing light at the time of said back-exposure in patterning of said implantation stop material film, or wherein intensity of exposing light at the time of said back-exposure in patterning of said protection film is less than intensity of exposing light at the time of said back-exposure in patterning of said implantation stop material film.

15. The method of manufacturing a semiconductor device according to claim 14, wherein said protection film to be formed on said amorphous semiconductor layer is formed so that its thickness is optimum in a region where said semiconductor layer is formed thickest on said substrate.

16. The method of manufacturing a semiconductor device according to claim 15, wherein a bottom-gate-type thin film transistor in which said first electrode is a gate electrode is formed as a semiconductor element by using said manufacturing method, and said thin film transistor is used as a switching element for driving each picture element of a matrix type display unit and/or a switching element of a driver circuit of a matrix type display unit.

17. The method of manufacturing a semiconductor device according to claim 14, wherein said protection film to be formed on said amorphous semiconductor layer is formed so that its thickness is optimum in a region where said first insulating layer is formed thinnest on said substrate.

18. The method of manufacturing a semiconductor device according to claim 17, wherein a bottom-gate-type thin film transistor in which said first electrode is a gate electrode is formed as a semiconductor element by using said manufacturing method, and said thin film transistor is used as a switching element for driving each picture element of a matrix type display unit and/or a switching element of a driver circuit of a matrix type display unit.

19. A method of manufacturing a semiconductor device, wherein said semiconductor device is comprising a semiconductor layer and an electrode are formed facing each other on a substrate with an insulating layer between them, and a plurality of thin film transistors which use a region of said semiconductor layer opposite to said electrode as an channel region are formed on the substrate, said manufacturing method comprising the steps of:

forming an amorphous semiconductor layer on said substrate, and further forming successively, on said amorphous semiconductor layer, an insulating protection film having an optimum thickness for a region which said amorphous semiconductor layer is formed thickest on said substrate;

forming a polycrystal semiconductor layer by applying laser annealing for polycrystallization of said semiconductor layer to said amorphous semiconductor layer from a side of said protection film;

patterning said polycrystal semiconductor layer and said protection film in a predetermined shape;

forming, after patterning, an insulating layer in such a manner that said polycrystal semiconductor and said protection film are covered;

forming a first conductive layer on said insulating layer, and then forming a first electrode by patterning said first conductive layer;

doping impurities to said polycrystal semiconductor layer using at least said first electrode as a mask, and forming impurity doped regions on both sides of said channel region of said polycrystal semiconductor layer;

forming, after said impurity doped regions are formed, a second insulating layer in such a manner that said first insulating layer and said first electrode are covered, and forming openings over said impurity doped regions of said polycrystal semiconductor layer in said second insulating layer; and forming second electrodes, connected with said impurity doped regions, at said openings.

20. The method of manufacturing a semiconductor according to claim 19, wherein the semiconductor device manufactured is a top-gate-type thin film transistor in which said first electrode is a gate electrode, and said thin film transistor is used as a switching element for driving each picture element of a matrix type display unit and/or a switching element of a driver circuit of a matrix type display unit.

* * * * *